United States Patent
Pingel et al.

(10) Patent No.: US 6,344,813 B1
(45) Date of Patent: *Feb. 5, 2002

(54) DIGITAL TO ANALOGUE CONVERTER

(75) Inventors: Jan Pingel; Uwe Zwickler, both of Bochum (DE); Sten Carlsen, Rødovre (DK)

(73) Assignee: Nokia Mobile Phones Limited, Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/175,783

(22) Filed: Oct. 20, 1998

(30) Foreign Application Priority Data

Oct. 23, 1997 (GB) ............................... 9722457

(51) Int. Cl.⁷ ................................. H03M 1/66
(52) U.S. Cl. ...................... 341/144; 341/147
(58) Field of Search .............. 341/144, 145, 341/147, 126, 152

(56) References Cited

U.S. PATENT DOCUMENTS

| | | | | |
|---|---|---|---|---|
| 4,006,475 A | * | 2/1977 | Candy et al. | 341/145 |
| 4,095,218 A | * | 6/1978 | Crouse | 341/145 |
| 4,686,509 A | * | 8/1987 | Araki et al. | 341/144 |
| 4,973,977 A | * | 11/1990 | Hawkins et al. | 341/144 |
| 5,191,331 A | | 3/1993 | Karema et al. | 341/131 |
| 5,245,345 A | * | 9/1993 | Kohdaka et al. | 341/152 |
| 5,248,972 A | | 9/1993 | Karema et al. | 341/143 |
| 5,311,179 A | | 5/1994 | Vaisanen et al. | 341/118 |
| 5,331,321 A | | 7/1994 | Mannonen | 341/110 |
| 5,701,106 A | | 12/1997 | Pikkarainen et al. | 332/100 |
| 5,731,772 A | | 3/1998 | Mikkola et al. | 341/118 |
| 5,734,683 A | | 3/1998 | Hulkko et al. | 375/316 |
| 5,784,017 A | * | 7/1998 | Craven | 341/126 |
| 5,786,782 A | | 7/1998 | Ostmann et al. | 341/141 |
| 5,936,564 A | * | 8/1999 | Jun | 341/144 |

FOREIGN PATENT DOCUMENTS

| | | |
|---|---|---|
| GB | 1154092 | 6/1969 |
| GB | 1499565 | 2/1978 |
| GB | 1537655 | 1/1979 |
| GB | 2000653 A | 1/1979 |
| GB | 1553697 | 10/1979 |
| GB | 1565104 | 4/1980 |
| GB | 2288932 | 11/1995 |

OTHER PUBLICATIONS

JP 060006230 (Pioneer), WPI Abstract Accession No. 94–052558/199407 & JAPIO Abstract 04362330.
United Kingdom Search Report.

* cited by examiner

*Primary Examiner*—Trong Phan
(74) *Attorney, Agent, or Firm*—Perman & Green, LLP

(57) ABSTRACT

The present invention discloses a device for converting a digital input into an analogue output, comprising means for generating a binary pulse signal in dependence on said digital input, a filter for filtering said binary pulse signal to obtain said analogue output where the level of the analogue output depends on the relation of high and low level pulses of the binary pulse signal during a period and the precision of the analogue output depends on the number of binary pulses during the period. The high and low level pulses in the binary pulse signal are spread through said period.

23 Claims, 5 Drawing Sheets

DIGITAL TO ANALOGUE CONVERTER

BACKGROUND OF THE INVENTION

The present invention is generally related to devices which generate analogue output voltages based on digital input values.

Devices which generate an analogue output voltage based on a digital input value are well known as Digital to Analogue Converters (DAC).

Digital to Analogue Converters are for example used to provide control voltages for the alignment of oscillation frequencies of transceiver circuits in devices for wireless communications like mobile phones, cordless phones or short range radio interfaces. For transmitter circuits a control voltage is necessary to align the voltage of a voltage controlled oscillator. The modulation frequency for a signal which has to be transmitted can be aligned this way. Also if the demodulation frequency of a receiver circuit has to be aligned Digital to Analogue converters are used.

Known Digital to Analogue converters can be constructed by weighted currents. The conventional circuits are based on analogue technology which is preferably designed for usage in analogue systems. This kind of implementation of Digital to Analogue Converters has the disadvantage that they need a large area of an integrated circuit.

Furthermore the usage of an analogue technology for the conventional Digital to Analogue Converters is not desirable if other parts of an electric device, where the digital to analogue conversion is needed for, are already designed in digital technology.

In the prior art Digital to Analogue Converters with digital technology are known. They are based on the so called "Pulse Width Modulation (PWM)". The analogue voltage will be generated in the way that a binary pulse signal is generated in dependence on a digital input value which is compared with a value from a counter. This binary pulse signal is low pass filtered with a conventional low pass filter, for example a RC-filter.

The approach has the disadvantage that it generates disturbing frequencies which requires complex filter structures to obtain a smooth output voltage.

Because of the complex filtering the desired output voltage will be reached slowly. The DAC based on Pulse Width Modulation cannot provide a new desired analogue output voltage based on a new digital input value fast.

SUMMARY OF THE INVENTION

According to the invention there is provided a device for converting a digital input into an analogue output comprising means for generating a binary pulse signal in dependence on said digital input, a filter for filtering said binary pulse signal to obtain said analogue output, where the level of the analogue output depends on the relation of high and low level pulses of the binary pulse signal during a period and the precision of the analogue output depends on the number of binary pulses during the period, characterised in that the high and low level pulses in the binary pulse signal are spread through said period. The analogue output might be a voltage.

The usage of Digital to Analogue Converters based on Pulse Width Modulation has shown that complex RC-filter structures are necessary to obtain a smooth analogue output voltage. The filtering is necessary to remove disturbing frequency components from the analogue output voltage because the generated binary pulse signal contains long sequences with high or low pulses, this leads to the generation of disturbing frequency components at low frequencies.

For the invention the binary pulse signal is generated in a way that the pulses are spread through the period and any disturbing frequency components on the analogue output voltage at higher frequency regions and the power of individual disturbing frequencies is lower. Now with the present invention a less complex RC-filter can be designed.

The filtering can be made even more simple if the high and low level pulses in the binary pulse signal are spread randomly through said period. The method preferably will be conducted with a binary pulse signal which starts with a start value and restarts after all possible bit combinations within the bit sequence have been generated. This means that the binary pulse signal is repeated periodically. The bit sequence can be a Pseudo Random Binary Sequence (PRBS). PRBS sequences can be produced by a shift register with feedback loops.

PRBS sequences can be selected among an indefinite number of PRBS sequences. Today they are used for the synchronisation and encryption in radio communication systems or to simulate normal traffic in digital transmission systems.

It is possible to produce only one binary pulse signal within one device and compare this binary sequence with several digital input values. In this way several output voltages can be obtained although the binary pulse signal is produced only once.

In a further advantageous embodiment of the invention the first pulses of the binary pulse signal are high level pulses or low level pulses until the desired analogue output voltage, which is defined by the digital input value, is reached. The number of necessary pulses to reach the desired output voltage may be given by a delay counter and a polarity register may give the information if high or low level bits are necessary to reach the desired output voltage.

It is also possible to generate said binary sequence with a digital filter that models the analogue filter. Based on the digital input value and the adjustments of the digital filter a binary pulse signal is generated where the relation of high and low level bits during a period to obtain the desired analogue output voltage after filtering said binary pulse signal. The digital filter contains a feedback line to compare the output signal of the digital filter with the digital input value.

The digital filter can furthermore be constructed in a way that said digital filter switches from a transient phase to a stationary phase when the result of the comparison between the output of said digital filter and the digital input is the first time zero. A transient phase is necessary if the output voltage is to be reached as quickly as possible. During the transient phase the coefficients of the digital filter are defined in a way that the binary pulse signal contains a higher number of high level bits if a higher output voltage has to be reached quickly.

The coefficients of the digital filter are defined in a way to generate a binary pulse signal which holds said analogue output voltage on the desired constant level according to the digital input during the stationary phase.

Inventive Digital to Analogue converters as defined here can be used to align transceiver circuits in mobile phones, cordless phone systems, short range radio interfaces or other communication devices. For example to provide control voltages for the alignment of the oscillation frequencies of transceiver circuits. For transmitter circuits an analogue control voltage is necessary to align the voltage of a voltage controlled oscillator. The modulation frequency for a signal which has to be transmitted can be aligned this way. The DAC can also be used for the alignment of the demodulation frequency of a receiver circuit.

BRIEF DESCRIPTION OF THE DRAWINGS

The present invention will now be described by way of example, with reference to the accompanying drawings, in which.

DETAILED DESCRIPTION OF THE INVENTION

Figure 1:
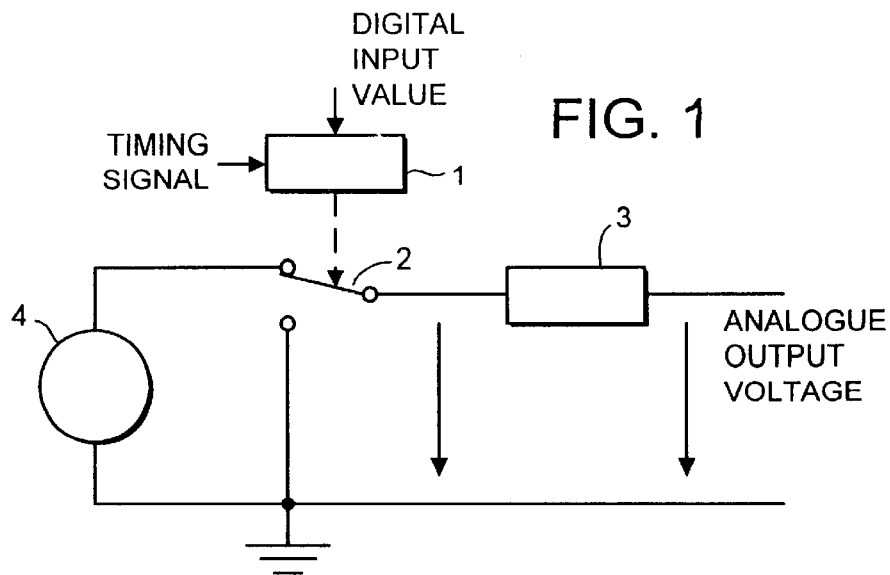
FIG. 1 shows a binary pulse signal generator connected to a circuit with power supply and low pass filter.

FIG. 1 shows the basic principle how a digital input value can be converted to an analogue output voltage by using a binary pulse signal. A digital input value represents the voltage to be generated and a timing signal are given to a binary pulse signal generator 1. A switch 2 is controlled by the binary sequence the generator 1. The switch 2 connects the input path of a low pass filter 3 either to a power source 4 or to ground. When the switch connects the low pass filter to the power source the analogue output voltage increases up to the voltage of the power supply, when the switch is connected to ground the analogue output voltage decreases.

If for example the binary pulse signal contains the same amount of high and low level pulses over a period half of the voltage of the power source 4 can be measured at the output of the filter 3.

Figure 2:
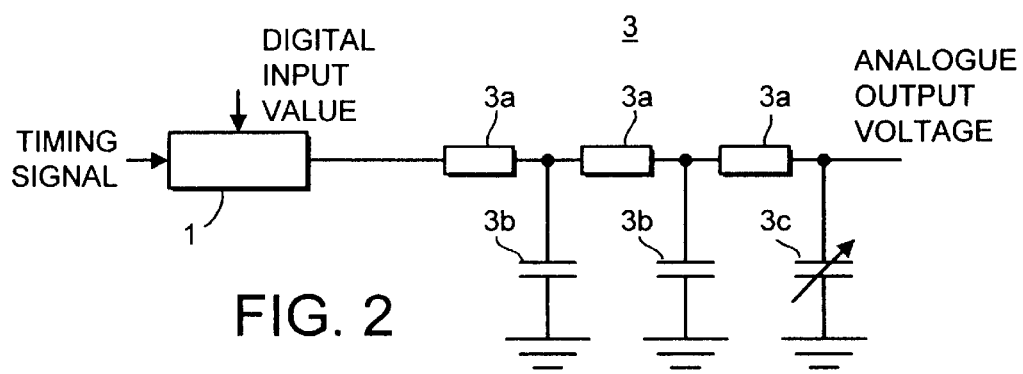
FIG. 2 shows a block diagram where the binary pulse signal generator is connected to a low pass filter.

FIG. 2 shows another block diagram of how a digital input value can be converted to an analogue output voltage. The binary pulse signal generator 1 receives a digital input value and a timing signal in the same way as in FIG. 1, but the output of the generator 1 is directly connected to the low pass filter 3. This kind of implementation is possible if low currents are demanded from the analogue output voltage or the binary sequence generator can provide the needed current. The low pass filter 3 of FIG. 2 is a so called RC-filter of third order. Filter 3 comprises resistors 3a and capacitors 3b,c. The capacitor 3c of the low pass filter is adjustable to adjust the filter frequencies if necessary.

Figure 3:
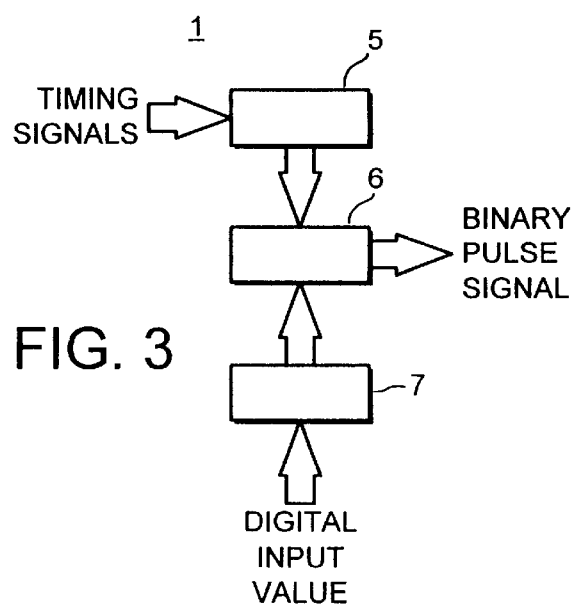
FIG. 3 shows a detailed view of the binary pulse signal generator of FIGS. 1 and 2.

FIG. 3 shows a detailed block diagram of the binary pulse signal generator 1 of FIG. 1 and FIG. 2. The timing signal is fed to a binary sequence generator 5 which generates a pseudo random binary sequence and is called a Pseudo Random Binary sequence (PRBS) generator further on. The digital input value is entered to a register 7. The outputs of the PRBS generator 5 and the register 7 are connected to a digital comparator 6. Comparator 6 compares the bit sequences from the PRBS generator 5 and the register 7. If the value of the output signal of the PRBS generator 5 is higher than the value of register 7 the comparator generates a high level pulse at its output, if the value of the generator is lower than the register value the comparator 3 generates a low level pulse. After each timing signal the PRBS generator generates a new binary sequence and this is compared with the present entry of register 7.

Figure 4:
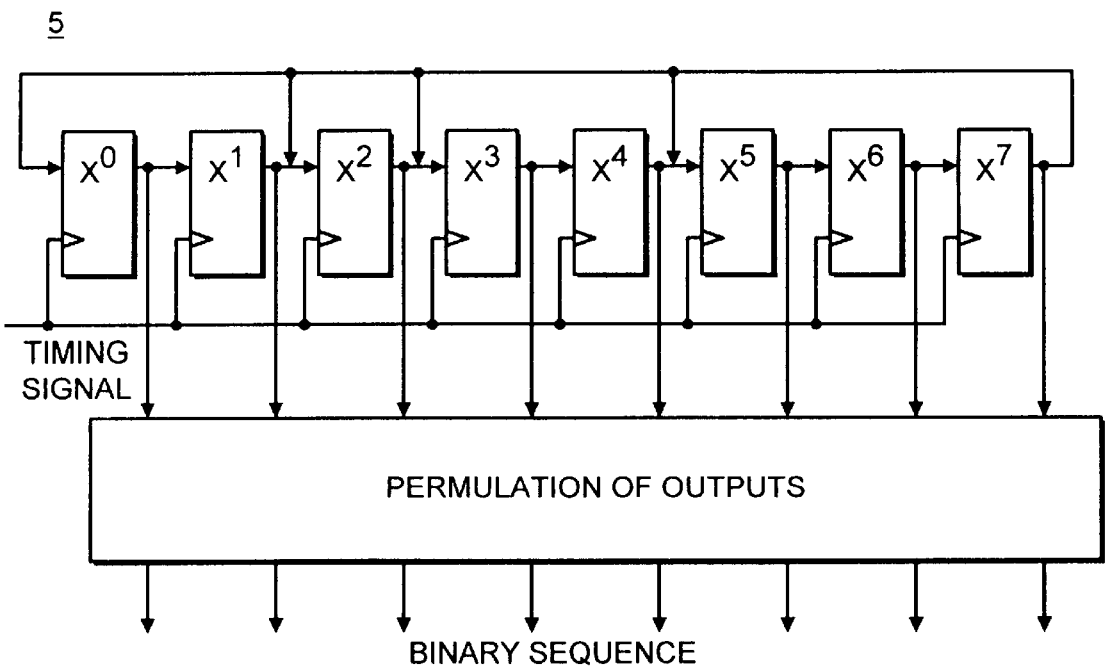
FIG. 4 shows a circuit which generates a pseudo random binary pulse signal.

In FIG. 4 a circuit is shown which can be preferably used to carry out the function of the PRBS generator 5. The circuit consists of a linear feedback shift register with the generator polynomial $g(x)=x^8+x^5+x^3+x^2+1$. The shift register generates a pseudo random binary sequence of 255 different eight bit words. The blocks $x^0$ to $x^7$ are D-Flip-Flops. It has to be noted that the feedback lines are exclusive or (xor) associated with the lines between the D-Flip-Flops.

Other PRBS generator constructions are possible. For example the shift register may contain parallel and separated feedback lines which are combined in an XOR gate before they are fed to the first ($x^0$) D-Flip-Flop.

It is also possible to add a permutation unit between the PRBS generator and the comparator as shown in FIG. 4 which permutes the output lines of the PRBS generator provided by the registers. This permutation unit is not essential for the invention and is not part of the following example.

In the prior art instead of this kind of a PRBS generator 5 a counter might be used which counts from 0 to 255 to generate the binary pulse signal. The following examples are made to compare the usage of a counter and a Pseudo Random Binary Sequence generator to give a better understanding of the present invention.

The power source of FIG. 1 may have a voltage of 5V. An analogue output voltage of 1.9 V maybe desired. If a system is used with eight-bit words the Least Significant Bit (LSB) corresponds to $\frac{1}{256}$ of the output voltage, so the digital input value has to represent the number 97. This is the bit word "0110 0001" which has to be compared to the output of the PRBS generator or with the output a counter.

The number of bits in a period (word) defines the precision with which an analogue output signal can be specified.

If a counter is used the following digital binary sequence is generated after each timing interval:

| No | Counter output | digital input value | comparison (binary pulse signal) | result |
|----|---------------|--------------------|-----|--------|
| 0 | 0000 0000 | 0110 0001 | 1 | |
| 1 | 0000 0001 | 0110 0001 | 1 | |
| 2 | 0000 0010 | 0110 0001 | 1 | |
| 3 | 0000 0011 | 0110 0001 | 1 | |
| 4 | 0000 0100 | 0110 0001 | 1 | |
| . | . | . | . | |
| 96 | 0110 0000 | 0110 0001 | 1 | |
| 97 | 0110 0001 | 0110 0001 | 0 | |
| . | . | . | . | |
| 252 | 1111 1100 | 0110 0001 | 0 | |
| 253 | 1111 1101 | 0110 0001 | 0 | |
| 254 | 1111 1110 | 0110 0001 | 0 | |
| 255 | 1111 1111 | 0110 0001 | 0 | |

It can be easily recognised that the binary pulse signal contains only "1" (high level pulses) until position 96 is reached. From position 97 to position 255 "0" (low level pulses) are generated. The counter begins from position 0 again after reaching position 255.

When a binary pulse signal with this bit sequence is filtered by a RC-Filter 3 a complex filter structure is necessary to remove the frequency components generated by the relatively long high level and low level sequences. The disturbing frequencies are in a low frequency region and have high power.

If we use a binary pulse generator like the shift register from FIG. 4 instead of the counter the following binary pulse signal is generated:

| No | PRBS output | digital input value | comparison (binary pulse signal) | result |
|---|---|---|---|---|
| 0 | 0000 0001 | 0110 0001 | | 1 |
| 1 | 0000 0010 | 0110 0001 | | 1 |
| 2 | 0000 0100 | 0110 0001 | | 1 |
| 3 | 0000 1000 | 0110 0001 | | 1 |
| 4 | 0001 0000 | 0110 0001 | | 1 |
| 5 | 0010 0000 | 0110 0001 | | 1 |
| 6 | 0100 0000 | 0110 0001 | | 1 |
| 7 | 1000 0000 | 0110 0001 | | 0 |
| 8 | 0010 1101 | 0110 0001 | | 1 |
| 9 | 0101 1010 | 0110 0001 | | 1 |
| 10 | 1011 0100 | 0110 0001 | | 0 |
| 11 | 0100 0101 | 0110 0001 | | 1 |
| 12 | 1000 1010 | 0110 0001 | | 0 |
| 13 | 0011 1001 | 0110 0001 | | 1 |
| . | . | . | | . |
| . | . | . | | . |
| . | . | . | | . |
| 242 | 0000 0110 | 0110 0001 | | 1 |
| 243 | 0000 1100 | 0110 0001 | | 1 |
| 244 | 0001 1000 | 0110 0001 | | 1 |
| 245 | 0011 0000 | 0110 0001 | | 1 |
| 246 | 0110 0000 | 0110 0001 | | 1 |
| 247 | 1100 0000 | 0110 0001 | | 0 |
| 248 | 1010 1101 | 0110 0001 | | 0 |
| 249 | 0111 0111 | 0110 0001 | | 0 |
| 250 | 1110 1110 | 0110 0001 | | 0 |
| 251 | 1111 0001 | 0110 0001 | | 0 |
| 252 | 1100 1111 | 0110 0001 | | 0 |
| 253 | 1011 0011 | 0110 0001 | | 0 |
| 254 | 0100 1011 | 0110 0001 | | 1 |
| 255 | 1001 0110 | 0110 0001 | | 0 |

It can be easily recognised that the comparison result is "1" (high level) until position 6 and then the shift register produces a bit stream wherein the bits of the binary pulse signal are spread randomly over the time. Also this binary pulse signal is filtered by RC-Filter 3, but now the filter can be constructed with less complexity because disturbing frequency components are shifted to higher frequency regions and the power of the individual disturbing frequencies is low compared to the example with the binary pulse signal which is generated with the aid of a counter.

After step 255 the next cycle with the same binary sequence starts. Therefore the random sequence generated by the PRBS generator is a Pseudo random binary sequence.

The output signal of one PRBS generator 5, as it is shown in FIG. 3, can be used to be Compared with several digital input values by a comparator 6. By this way it is possible to implement several digital to analogue converters within the same integrated circuit with only one PRBS generator.

A binary pulse signal which is generated by the method described above is shown in FIG. 8 for the timing cycles 0 to 260. The digital input signal is not the same as for the example described above.

Figure 8:
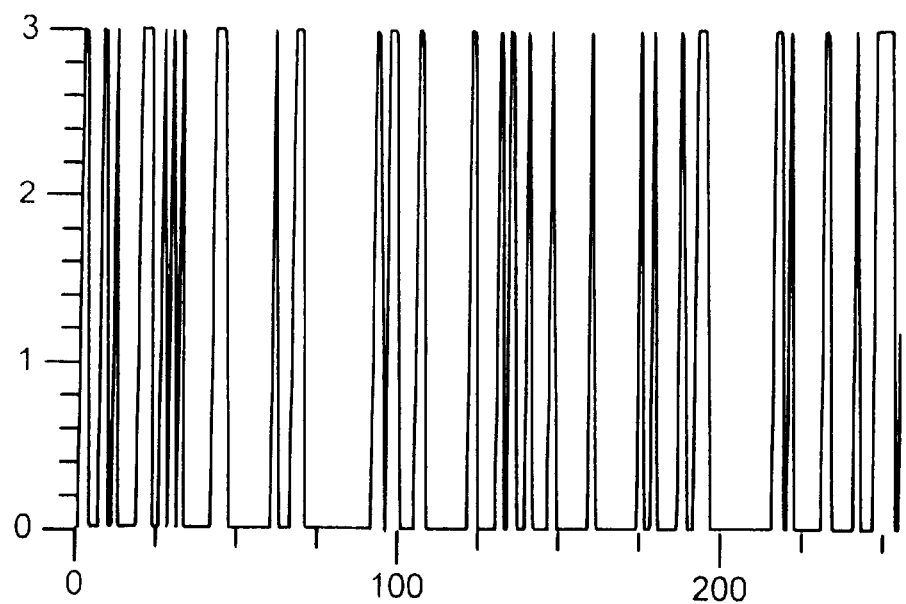
FIG. 8 shows a binary pulse signal according to the invention.
Figure 9:
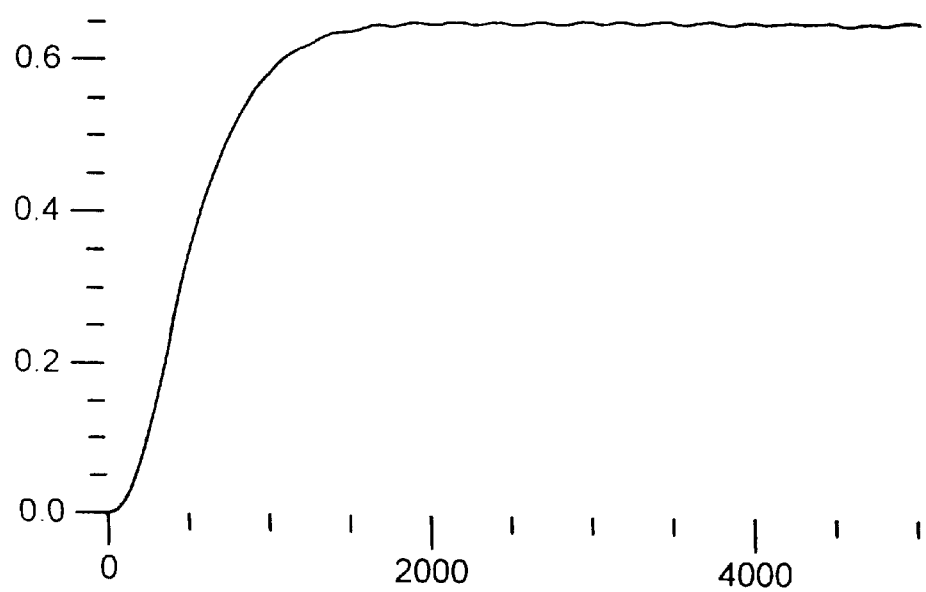
FIG. 9 shows the binary pulse signal after filtering.

The same binary pulse signal of FIG. 8 after filtering is shown in FIG. 9. It is shown that the desired output voltage (0.65 V for this example) is reached after about 2000 timing cycles.

Figure 5:
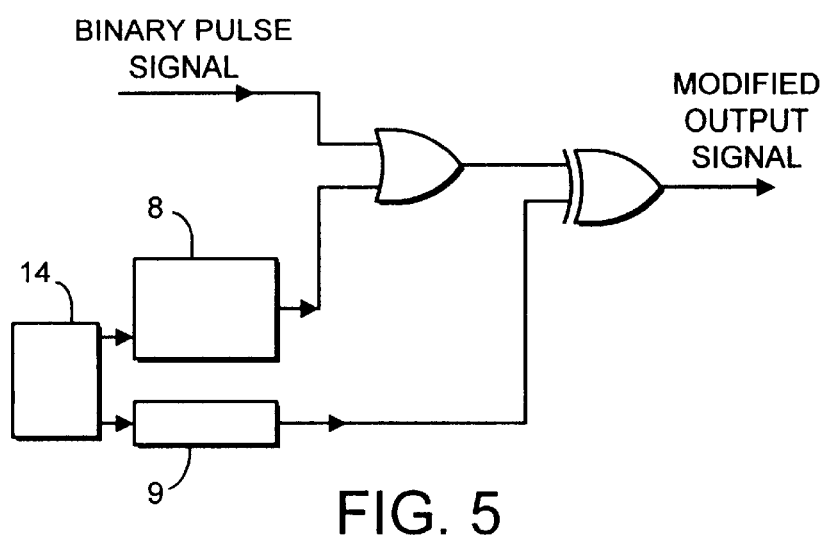
FIG. 5 shows a block diagram with a delay counter and a polarity register according to the invention.

FIG. 5 shows a circuit which provides high level pulses for a time long enough that filter 3 is charged to the correct output voltage. On the other hand it can provide a low level for a time long enough that the filter 3 is discharged to the correct output voltage. A delay counter 8 provides the information how long the binary pulse signal has to be held on a high or low level. Polarity Register 9 defines if a high level (increase output voltage) or a low level (decrease output voltage) is needed.

A Central Processing Unit 14 is used to calculate the values for the delay counter 8 and the polarity register 9.

The delay counter is associated with the binary pulse signal from the binary pulse signal generator via an OR-junction and the result is associated with the polarity register via an XNOR-junction.

If the desired analogue output voltage is lower than the current analogue output voltage a "0" is stored in the polarity register to hold the output voltage at a low level until almost the analogue output voltage is reached.

The modified output signal is on the one hand the binary pulse signal if the desired analogue output voltage is reached and should be kept. On the other hand a high level pulse sequence "1" is provided if the voltage has to be increased and a "0" sequence if he voltage has to be decreased.

Figure 6:
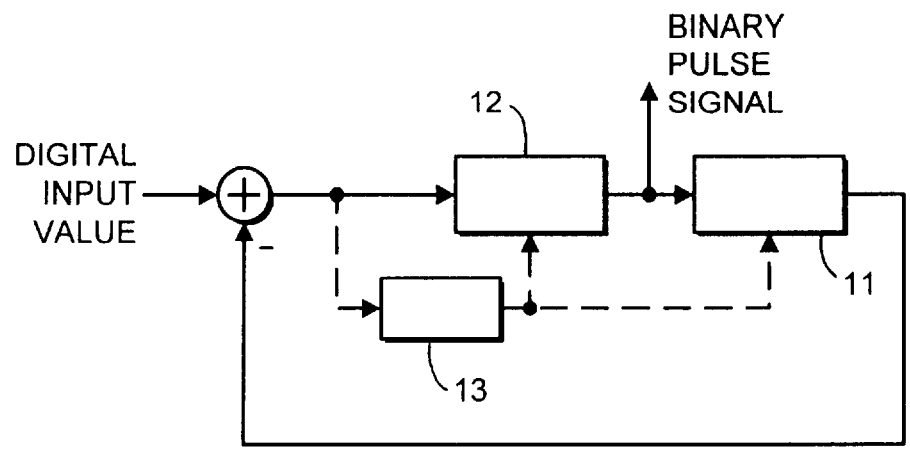
FIG. 6 shows the block diagram of the digital filter according to the invention.

FIG. 6 shows another approach to generate a binary pulse signal wherein the high and low level pulses are spread through a period.

The binary pulse signal is generated with the support of a digital filter 11 that models the analogue system, this means the RC Low pass filter 3, as it is shown in FIG. 1 and 2. The output signal of the digital filter 11 is compared with the digital input value within the threshold block (comparator) 12. If the difference of the digital input value and the output of the digital filter 11 is positive then the threshold block 12 generates a high level pulse. If the difference is negative a low level pulse is generated.

When the digital to analogue conversion is started the difference between the digital input value and the output of filter 11 is always positive. This indicates the transient state or stage of the conversion process. When the difference reaches the first time zero then a state transition takes place. The system is then in the stationary state.

The digital filter 11 works with two different coefficients. The choice of the coefficient is controlled by a state machine 13. The state machine is controlled by the same signal like the threshold block 12. The first coefficient is used when the system is in the transient state, this means the input value of the state machine is positive. The second coefficient is used after state machine has entered the stationary phase, this means the input value of the state machine is negative.

Figure 7:
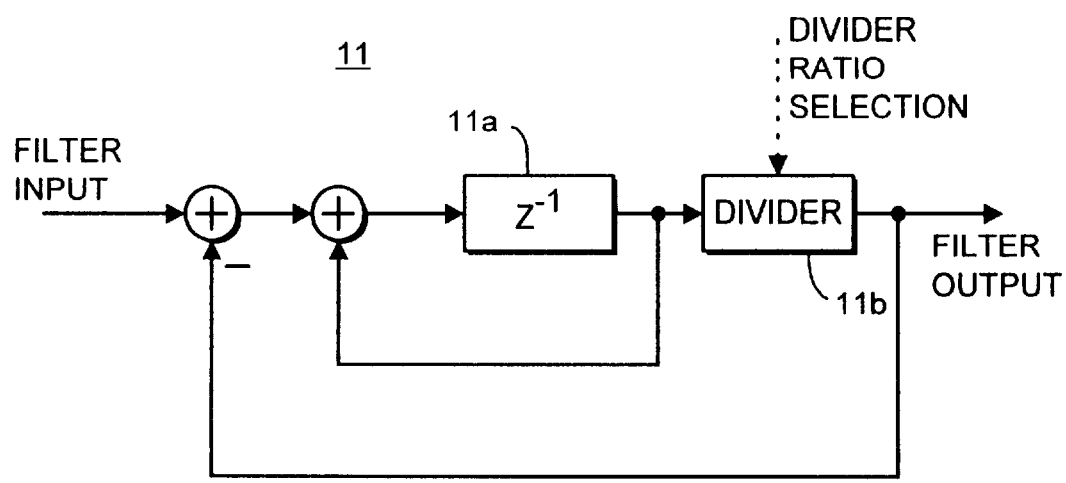
FIG. 7 shows a detailed view of the digital filter of FIG. 6.

FIG. 7 depicts the structure of the digital filter 11. The filter is a first order Infinite Impulse Response filter (IIR-filter) with a delay block ($Z^{-1}$) 11a and a divider 11b. The filter coefficients are defined by the divider value of the divider 11b. The control signal for the divider comes from the state machine 13. When the system is in the transient phase the divider 11b divides the signal for example by 32, when the system is in the stationary phase the divider 11b divides the signal for example by 512. The divider values depend on the analogue system (RC filter) which should be modelled and may vary for other systems.

When the system is in the transient phase the dividing value is chosen such that the required analogue output voltage is reached as quickly as possible.

The dividing value for the stationary state is chosen such that the analogue low pass filter keeps the required output voltage. The binary pulse signal is then characterised in that the pulses in the binary pulse signal are spread through a period. Every moment when the output voltage of the RC filter is below the desired output voltage a high level is generated by this circuit and vice versa. The number of bits in a period, i.e. the density or frequency of bits, defines the precision of the analogue output in the same way as for the previous embodiments.

Figure 10:
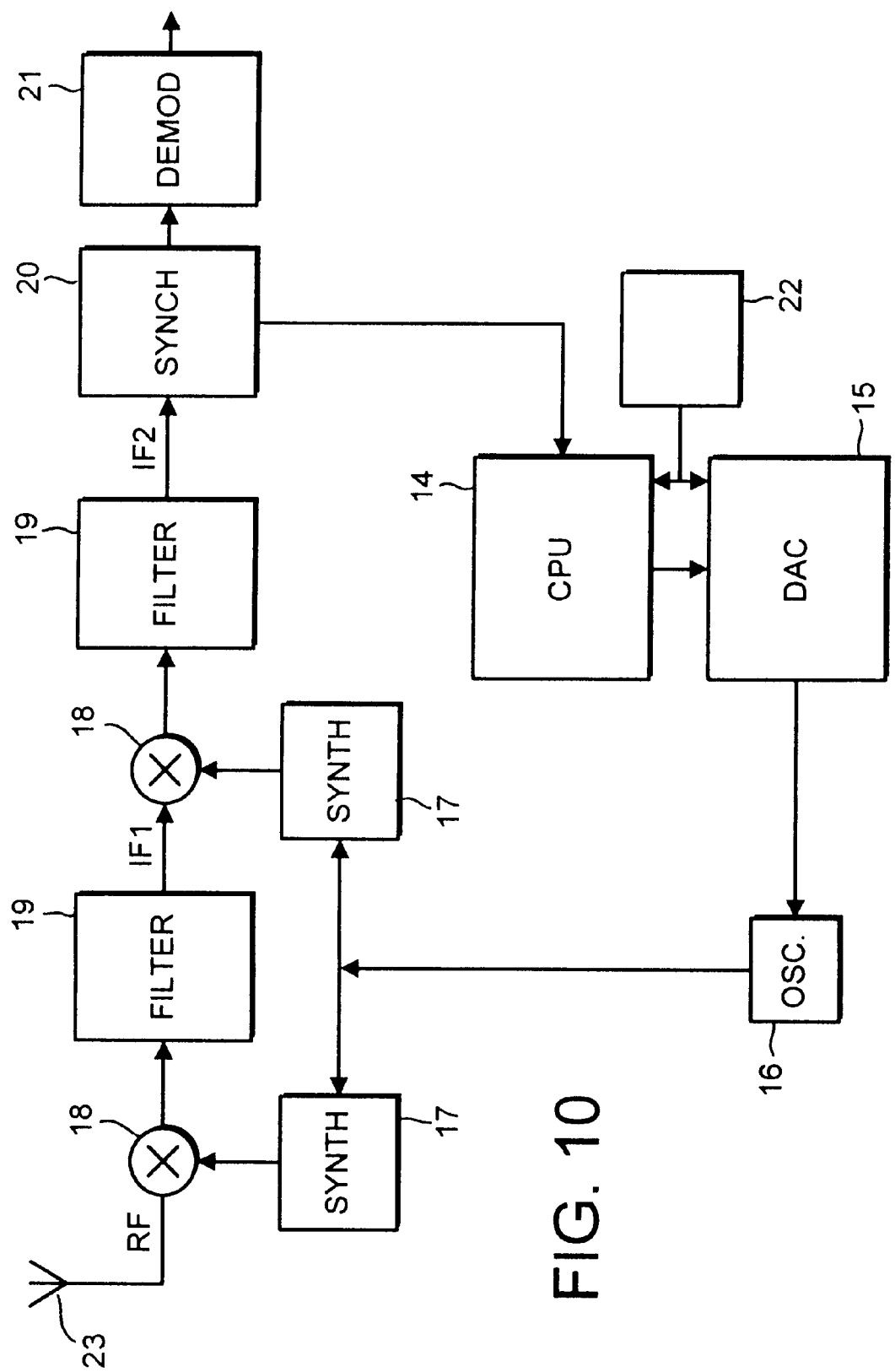
FIG. 10 shows the general structure of a receiver circuit.

A general block diagram of a receiver circuit as it is used in mobile phones or other digital radio communication devices is shown in FIG. 10.

An antenna 23 receives a radio frequency signal which enters a first mixer 18 and a first filter 19 where the signal is demodulated to the first intermediate frequency IF1 and then to a second mixer 18 and a second filter 19 where the signal is demodulated to the second intermediate frequency IF 2. The IF 2 signal then enters a synchronisation unit 20 and afterwards enters a demodulator 21 which supplies a demodulated digital signal for further processing, for example decoding a speech signal.

The synchronisation unit detects if the frequency of the IF2 signal is correct and sends a signal to the Central Processing unit 14 which further on calculates a correction value which is sent to the Digital to Analogue Converter 15. The processed correction value is the digital input signal for the Digital to Analogue Converter 15.

The clock unit 22 provides the timing signal for the Central Processing Unit 14 and the Digital to Analogue Converter 15. Based on the digital input value and the timing signal the DAC 15 provides a analogue output voltage which is supplied to a voltage tuned crystal oscillator 16. Oscillator 16 provides the basic frequency signal for a first and second synthesizer 17 which provide the down conversion frequencies for the first and second mixers 18.

The present invention may include any novel feature disclosed herein either explicitly or implicitly or any generalisation thereof irrespective of whether or not it relates to the presently claimed invention or mitigates any or all of the problems addressed. In view of the foregoing description it will be evident to a person skilled in the art that various modifications may be made within the scope of invention.

What is claimed is:

1. A device for converting a digital input into an analogue output comprising
   means for generating a binary pulse signal in dependence on said digital input,
   a filter for filtering said binary pulse signal to obtain said analogue output,
   where the level of the analogue output depends on the relation of high and low level pulses of the binary pulse signal during a period,
   the precision of the analogue output depends on the number of binary pulses during the period,
   the high and low level pulses in the binary pulse signal are spread randomly through said period;
      wherein said binary pulse signal is generated by comparison of said digital input with the output signal of a random number generator.

2. A device according to claim 1 characterized in that said random number generator is a shift register.

3. A device according to claim 1 characterized in that said sequence generated by said random number generator is compared with more than one digital input values to obtain more than one analogue outputs.

4. A device according to claim 1 characterised in that the first pulses of the binary pulse signal are high level pulses or low level pulses until the desired analogue output is reached.

5. A device according to claim 1 characterised in that the binary pulse signal is repeated periodically.

6. A device according to claim 1 characterised in that said binary sequence is generated by a digital filter that models said filter.

7. A device according to claim 1 wherein the high and low level pulses are spread through said period when the analogue output meets predetermined criteria.

8. A device according to claim 7 wherein before the analogue output meets predetermined criteria the digital filter generates a binary pulse signal which increases said analogue output rapidly.

9. A device according to claim 7 wherein when the analogue output meets the predetermined criteria the digital filter generates a binary pulse signal which holds said analogue output signal on a substantially constant level.

10. A device according to claim 1 characterised in that said analogue output is a voltage.

11. A device according to claim 1 characterised in that said analogue output voltage is used to align transceiver circuits in mobile phones, cordless phone systems, short range radio communication interfaces or other radio communication devices.

12. A device for converting a digital input signal into an analogue output signal, said device comprising:
   means for generating a binary pulse signal in dependence on said digital input signal;
   a filter for filtering said binary pulse signal to obtain said analogue output;
   wherein the level of analogue output signal depends on the relation of high and low level pulses of the binary pulse signal during a period, the precision of the analogue output signal depends on the number of binary pulses during the period, the high and low level pulses in the binary pulse signal are spread through said period, and the first pulses of the binary pulse signal are either only high level pulses or only low level pulses until the desired analogue output signal is reached.

13. A device according to claim 13, wherein the high and low level pulses in the binary pulse signal are spread randomly through said period.

14. A device according to claim 13, wherein said binary pulse signal is generated by comparison of said digital input signal with the output signal of a random number generator.

15. A device according to claim 14, wherein said random number generator is a shift register.

16. A device according to claim 14, wherein said sequence generated by said random number generator is compared with more than one digital input signal value to obtain more than one analogue output signal.

17. A device according to claim 12, wherein the binary pulse signal is repeated periodically.

18. A device according to claim 12, wherein said binary sequence is generated by a digital filter that models said filter.

19. A device according to claim 12, wherein the high and low level pulses are spread through said period when the analogue output signal meets a predetermined criteria.

20. A device according to claim 19, wherein before the analogue output signal meets said predetermined criteria the digital filter generates a binary signal which rapidly increases said analogue output signal.

21. A device according to claim 19, wherein when the analogue output signal meets the predetermined criteria the digital filter generates a binary pulse signal which holds said analogue output signal on a substantially constant level.

22. A device according to claim 12, wherein said analogue output signal is a voltage.

23. A device according to claim 12, wherein said analogue output signal is used to align transceiver circuits in mobile phones, cordless phone systems, short range radio communication interfaces, or other radio communication devices.

* * * * *

UNITED STATES PATENT AND TRADEMARK OFFICE
CERTIFICATE OF CORRECTION

PATENT NO.     : 6,344,813 B1  
DATED          : February 5, 2002  
INVENTOR(S)    : Pingel et al.

Page 1 of 1

It is certified that error appears in the above-identified patent and that said Letters Patent is hereby corrected as shown below:

Column 8,
Line 45, delete "according to claim 13" and insert -- according to claim 12 --.

Signed and Sealed this

Twenty-eighth Day of May, 2002

Attest:

JAMES E. ROGAN  
Attesting Officer     Director of the United States Patent and Trademark Office